(12) United States Patent
Kojima (10) Patent No.: US 12,148,638 B2
(45) Date of Patent: Nov. 19, 2024

(54) ABNORMALITY DETECTION SYSTEM

(71) Applicant: DENSO CORPORATION, Kariya (JP)

(72) Inventor: Satoshi Kojima, Kariya (JP)

(73) Assignee: DENSO CORPORATION, Kariya (JP)

( * ) Notice: Subject to any disclaimer, the term of this patent is extended or adjusted under 35 U.S.C. 154(b) by 434 days.

(21) Appl. No.: 17/547,381

(22) Filed: Dec. 10, 2021

(65) Prior Publication Data

US 2022/0102173 A1 Mar. 31, 2022

Related U.S. Application Data (63) Continuation of application No. PCT/JP2020/029540, filed on Jul. 31, 2020.

(30) Foreign Application Priority Data

Aug. 8, 2019 (JP) .................. 2019-146524

(51) Int. Cl.
*H01L 21/67* (2006.01)
*G01N 25/72* (2006.01)
*G05B 23/02* (2006.01)

(52) U.S. Cl.
CPC ....... *H01L 21/67248* (2013.01); *G01N 25/72* (2013.01); *G05B 23/0235* (2013.01); *G05B 23/024* (2013.01); *H01L 21/67259* (2013.01)

(58) Field of Classification Search
USPC ....................................................... 702/130
See application file for complete search history.

(56) References Cited

U.S. PATENT DOCUMENTS

| | | | |
|---|---|---|---|
| 6,654,668 B1 | 11/2003 | Harada et al. | |
| 2002/0027942 A1 | 3/2002 | Nishijima et al. | |
| 2005/0267621 A1* | 12/2005 | Sato | H01L 21/67248 700/121 |
| 2007/0010906 A1* | 1/2007 | Abe | G05B 23/0235 700/121 |
| 2007/0219736 A1* | 9/2007 | Okita | G03F 7/70525 702/81 |
| 2009/0076763 A1 | 3/2009 | Okamura et al. | |
| 2020/0249249 A1* | 8/2020 | Umeki | G01N 35/1016 |

FOREIGN PATENT DOCUMENTS

JP 2012-151247 A 8/2012

* cited by examiner

*Primary Examiner* — Paul D Lee
(74) *Attorney, Agent, or Firm* — Posz Law Group, PLC (57) ABSTRACT

An abnormality detection system includes a waveform acquisition unit configured to acquire waveform data that changes over time; an abnormality degree calculation unit, and an abnormality determination unit. The abnormality degree calculation unit is configured to calculate an abnormality degree based on a cumulative value obtained by accumulating absolute values of differences in data values for each unit time from the waveform data acquired by the waveform acquisition unit. The abnormality determination unit is configured to determine whether the waveform data is normal or abnormal based on the abnormality degree calculated by the abnormality degree calculation unit.

7 Claims, 9 Drawing Sheets

✕ ABNORMALITY DATA
○ NORMAL DATA

ABNORMALITY DETECTION SYSTEM

CROSS REFERENCE TO RELATED APPLICATION

The present application is a continuation application of International Patent Application No. PCT/JP2020/029540 filed on Jul. 31, 2020, which designated the U.S. and claims the benefit of priority from Japanese Patent Application No. 2019-146524 filed on Aug. 8, 2019. The entire disclosures of all of the above applications are incorporated herein by reference.

TECHNICAL FIELD

The present disclosure relates to an abnormality detection system that detects defects using waveform data.

BACKGROUND

In order to minimize the occurrence of defects in a semiconductor wafer, it is determined whether the semiconductor wafer is accurately placed on a plate and processed normally.

SUMMARY

According to an aspect of the present disclosure, an abnormality detection system includes: a waveform acquisition unit configured to acquire waveform data that changes over time; an abnormality degree calculation unit configured to calculate an abnormality degree based on a cumulative value obtained by accumulating absolute values of differences in data values for each unit time from the waveform data acquired by the waveform acquisition unit; and an abnormality determination unit configured to determine whether the waveform data is normal or abnormal based on the abnormality degree calculated by the abnormality degree calculation unit.

DESCRIPTION OF EMBODIMENT

To begin with, examples of relevant techniques will be described.

In order to form a resist mask on a semiconductor wafer, a resist coating step, an exposure step, a developing step, and the like are performed on the surface of the semiconductor wafer. For example, in the coating step, a resist is applied and a heating process and a cooling process are performed. In the developing step, a heating process and a cooling process are performed for development. In the heating process, the semiconductor wafer is placed on a heating plate and the heating plate is placed in a heating device maintained at a desired heating temperature. In the cooling process, the semiconductor wafer is placed on a cooling plate and the cooling plate placed in a cooling device maintained at a desired cooling temperature. Thus, the temperature of the semiconductor wafer is controlled to a desired temperature.

At this time, in order to minimize the occurrence of defects in the semiconductor wafer, it is desirable to more quickly and accurately determine whether the semiconductor wafer is accurately placed on the heating plate or the cooling plate and processed normally.

If the transfer position of the semiconductor wafer is deviated, the semiconductor wafer may be positioned on a guide portion of the heating plate or cooling plate after the transportation. The semiconductor wafer is heated or cooled in that state, resulting in defects. Such defects will be found in the subsequent inspection step. When the defects are detected in the inspection step, a large amount of defective products are often already manufactured. Therefore, it is desired to detect the occurrence of defects at the same time as the completion of the resist coating step and the developing step.

Therefore, in the resist coating step and the developing step, the deviation in the transfer position is detected based on the temperature of the heating plate and the cooling plate. The wafer that has been normally processed without the deviation in the transfer position is distinguished from the wafer that has been abnormally processed due to the deviation in the transfer position.

For example, a semiconductor wafer heated in a heating process is transported and placed on a cooling plate. Since the semiconductor wafer is heated to have a temperature in a range of 100° C. to 200° C. in the heating process, the semiconductor wafer having a high temperature gives heat on the cooling plate. Therefore, the temperature of the cooling plate rises once. If the semiconductor wafer is not accurately conveyed and is positioned on the guide portion so as to be placed diagonally on the cooling plate, the distance between the cooling plate and the semiconductor wafer is increased. In this case, since the heat conduction is small, the rise in temperature of the cooling plate becomes small. The same thing happens when a semiconductor wafer is placed on a heating plate and heated. Abnormalities can be detected utilizing this phenomenon. For example, a temperature integrated area is calculated and compared with a threshold value. The temperature integrated area is an area of a range surrounded by a temperature curve and a set temperature when the change in temperature of the heating plate over time is represented by a graph.

However, when the abnormalities are detected in this way, in some cases, there is no difference between the temperature integrated area of the normal data when the process is normally performed and the temperature integrated area of the abnormality data when the process is abnormally performed. In this case, it is not possible to accurately distinguish a normally processed wafer from an abnormally processed wafer. A normally processed wafer may be erroneously detected as an abnormally processed wafer. In such a case, the manufacturing is interrupted even though the process is normally performed. The present disclosure provides an abnormality detection system capable of detecting abnormalities more quickly and accurately.

The abnormality detection system according to one aspect of the present disclosure includes: a waveform acquisition unit configured to acquire waveform data that changes over time; an abnormality degree calculation unit configured to calculate an abnormality degree based on a cumulative value obtained by accumulating absolute values of differences in data values for each unit time from the waveform data acquired by the waveform acquisition unit; and an abnormality determination unit configured to determine whether the waveform data is normal or abnormal based on the abnormality degree calculated by the abnormality degree calculation unit.

In this way, the cumulative value is obtained by accumulating the absolute value of the difference in the data value for each unit time from the waveform data changing in time series, and the abnormality degree is calculated from the cumulative value. Then, it is determined whether the waveform data is normal or abnormal based on the calculated abnormality degree. As a result, the abnormality can be accurately detected. Further, the abnormality detection can be performed more quickly since the abnormality detection can be performed each time.

The reference numerals attached to the components and the like indicate an example of correspondence between the components and the like and specific components and the like in embodiments to be described below.

Hereinafter, an embodiment of the present disclosure will be described with reference to the drawings. In each embodiment described below, same or equivalent parts are designated with the same reference numerals.

An abnormality detection system according to an embodiment will be described. The abnormality detection system is used to detect an abnormality in a coating/developing apparatus that performs a resist coating step or a developing step on a semiconductor wafer.

When a resist is applied to a semiconductor wafer and then patterned to obtain a desired pattern, the resist coating step, the exposure step, and the developing step are performed in this order. The coating step is a step of coating the resist on the semiconductor wafer, and the resist is stabilized by heating and cooling before and after the step. The subsequent exposure step is a step of irradiating light to perform exposure. Light is irradiated with a photomask having a shape corresponding to the desired pattern, to transfer the pattern. The developing step is a step of forming a resist mask of a desired pattern by development. The unexposed portion is removed by development in case of the negative resist, or the photosensitive part is removed by development in case of the positive resist.

The coating/developing apparatus is used for performing the coating step and the developing step. Since both the coating step and the developing step include a heating process and a cooling process, the coating step and the developing step are performed by the same coating/developing apparatus. The exposure step is performed between the coating step and the developing step. The exposure step is performed by taking out the semiconductor wafer from the coating/developing apparatus and transporting it to the exposure apparatus.

Hereinafter, resist patterning will be described, including a coating step and a developing step using a coating/developing apparatus to which an abnormality detection system is applied.

Figure 1A:
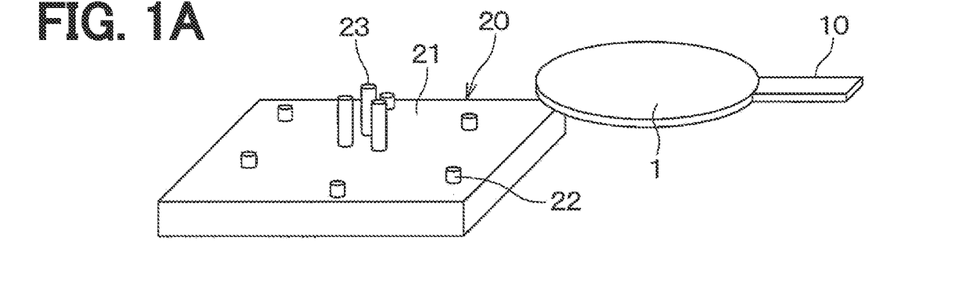
FIG. 1A is a perspective view showing a process of forming a resist mask using a coating/developing apparatus according to an embodiment.

The coating step using the coating/developing apparatus is performed by, for example, a method shown in FIGS. 1A to 1I. First, as shown in FIG. 1A, a semiconductor wafer 1 before the resist coating is grasped by a transfer arm 10 as a work, and is moved above a mounting surface 21 of a heating plate 20 corresponding to a mounting plate arranged in the heating device during the heating process. At this time, the inside of the heating device is already heated to a temperature desired for performing the heating process, for example, 200° C. The heating plate 20 is also heated by being exposed to that temperature and is set in a state of being heated to the temperature at which the heating process is performed.

The heating plate 20 has a guide portion 22 composed of guide pins corresponding to the outer edge of the semiconductor wafer 1 and an elevating pin 23 for raising and lowering the semiconductor wafer 1. The guide portion 22 is provided at six locations along the outer edge of the semiconductor wafer 1, for example, at equal intervals. The elevating pins 23 are provided in a triangular shape at three positions at the center of the guide portion 22, and are configured to be elevating.

Figure 1B:
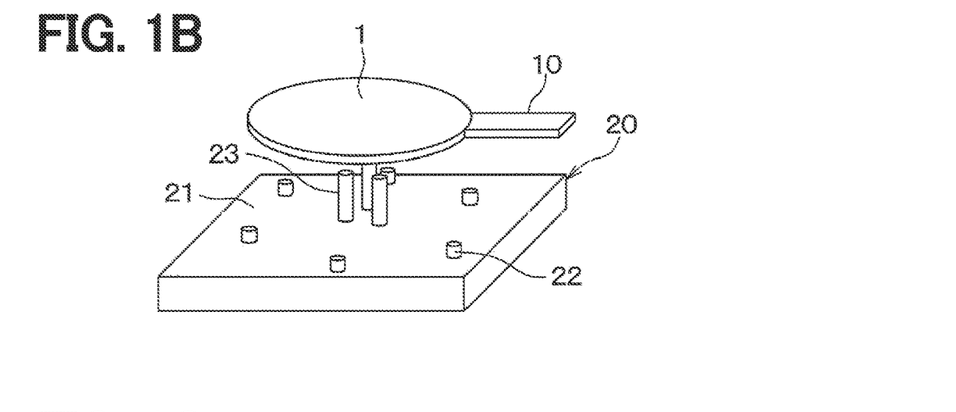
FIG. 1B is a perspective view showing a process of forming a resist mask following FIG. 1A.
Figure 1C:
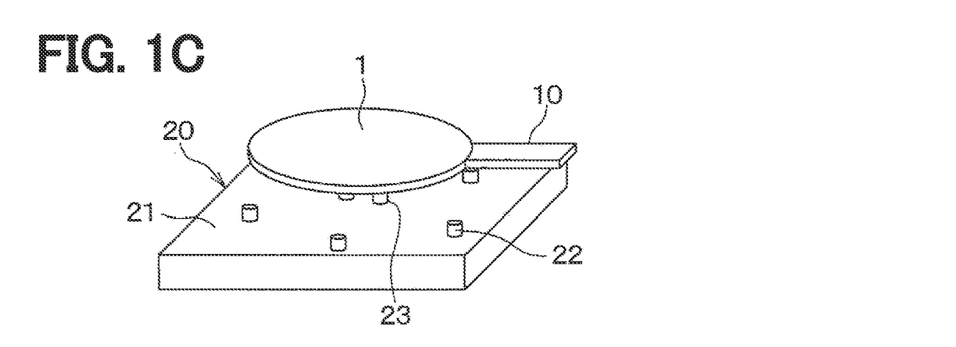
FIG. 1C is a perspective view showing a process of forming a resist mask following FIG. 1B.
Figure 1D:
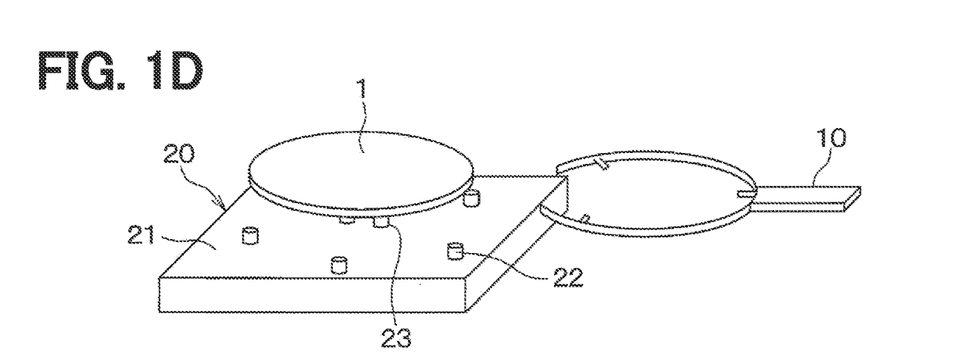
FIG. 1D is a perspective view showing a process of forming a resist mask following FIG. 1C.
Figure 1E:
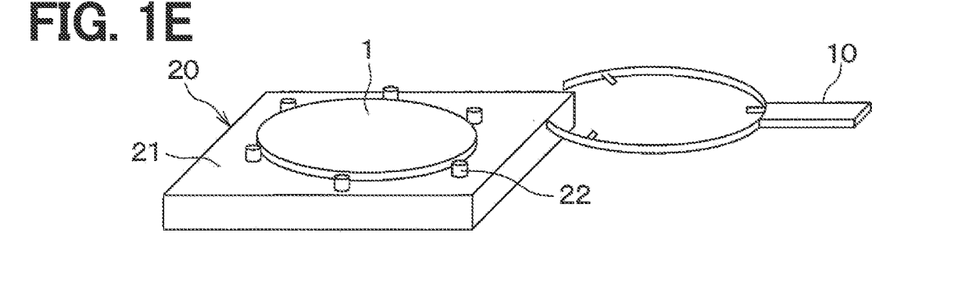
FIG. 1E is a perspective view showing a process of forming a resist mask following FIG. 1D.

As shown in FIG. 1B, the transfer arm 10 is moved to a position above the heating plate 20 so that the center position of the semiconductor wafer 1 coincides with the elevating pin 23. Then, while loosening the supporting of the semiconductor wafer 1 by the transfer arm 10, the semiconductor wafer 1 is placed on the elevating pin 23 as shown in FIG. 1C. Then, the transfer arm 10 is moved as shown in FIG. 1D such that only the semiconductor wafer 1 is left on the elevating pin 23. After that, as shown in FIG. 1E, the elevating pin 23 is further lowered to bring the semiconductor wafer 1 into contact with the mounting surface 21 of the heating plate 20. As a result, the semiconductor wafer 1 is lowered while the displacement is suppressed by the guide portion 22. Then, in this state, the semiconductor wafer 1 is placed in the heating device for a desired time to carry out the heating process. The moisture adhering to the semiconductor wafer 1 can be removed by heating at this time.

Figure 1F:
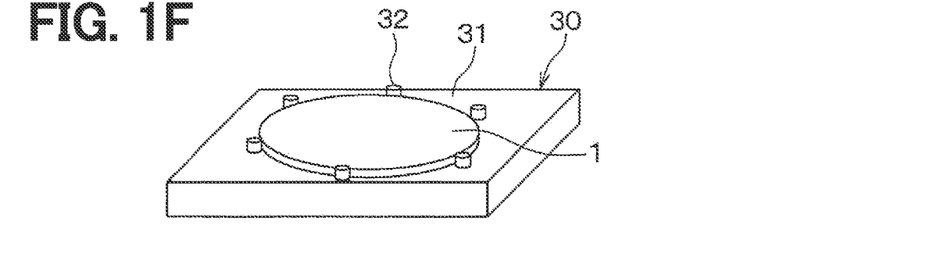
FIG. 1F is a perspective view showing a process of forming a resist mask following FIG. 1E.

Subsequently, the semiconductor wafer 1 is grasped again by the transfer arm 10 after the heating process is completed and moved into the cooling device for performing the cooling process. Then, the semiconductor wafer 1 is moved to a position above the mounting surface 31 of the cooling plate 30 corresponding to the mounting plate arranged in the cooling device. Then, as shown in FIG. 1F, the semiconductor wafer 1 is brought into contact with the mounting surface 31 of the cooling plate 30 so that the displacement is suppressed by the guide portion 32 by the same method as in FIGS. 1A to 1E described above. At this time as well, the inside of the cooling device is already cooled to a temperature desired for performing the cooling process, for example, 23° C. The cooling plate 30 is also exposed to that temperature, and is set in a state of being cooled to the temperature at which the cooling process is performed. Then, in this state, the semiconductor wafer 1 is installed in the cooling device for a desired time to carry out the cooling process. The semiconductor wafer 1 heated by the above-mentioned heating process can be cooled by this cooling process.

Figure 1G:
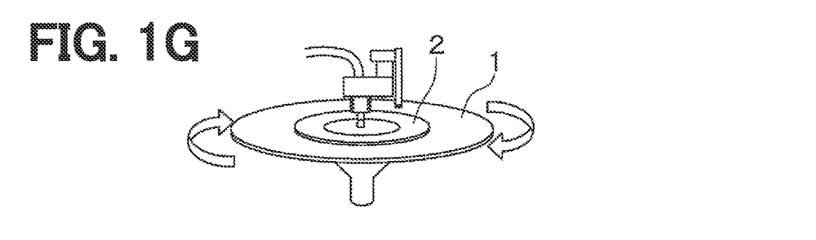
FIG. 1G is a perspective view showing a process of forming a resist mask following FIG. 1F.

After that, as shown in FIG. 1G, the semiconductor wafer 1 is conveyed to a spin coater, and the resist 2 composed of the photosensitive resin is applied to the surface of the semiconductor wafer 1.

Figure 1H:
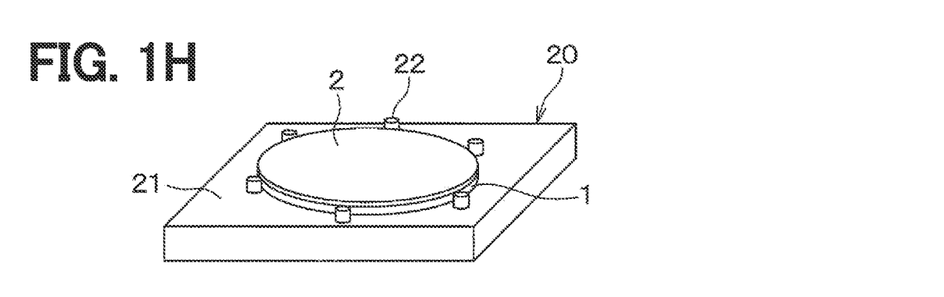
FIG. 1H is a perspective view showing a process of forming a resist mask following FIG. 1G.

Subsequently, the semiconductor wafer 1 coated with the resist 2 is grasped by the transfer arm 10 as a work and transferred into the heating device. Then, as shown in FIG. 1H, the semiconductor wafer 1 coated with the resist 2 is placed on the heating plate 20 by the same method as in FIGS. 1A to 1E described above. Also at this time, the inside of the heating device is already in a state of being heated to a desired temperature for performing the heating process, for example, 200° C. The heating plate 20 is also in a state of being exposed to that temperature, and is set in a state of being heated to the temperature at which the heating process is performed. Then, in this state, the semiconductor wafer 1 is placed in the heating device for a desired time to carry out the heating process. As a result, the semiconductor wafer 1 is heated and the solvent contained in the resist 2 is blown off.

Figure 1I:
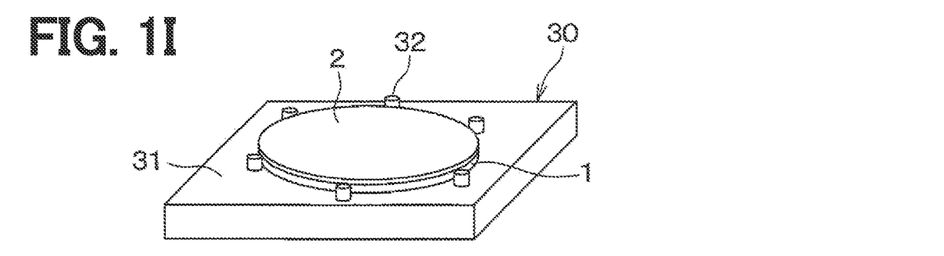
FIG. 1I is a perspective view showing a process of forming a resist mask following FIG. 1H.

Further, the semiconductor wafer 1 after the heating process is completed is conveyed to the cooling device, and the semiconductor wafer 1 is placed to contact on the mounting surface 31 of the cooling plate 30 as shown in FIG. 1I by the same method as in FIGS. 1A to 1E. Also at this time, the inside of the cooling device is already in a state of being cooled to a desired temperature for performing the cooling process, for example, 23° C. The cooling plate 30 is also in a state of being exposed to that temperature, and is set in a state of being cooled to the temperature at which the cooling process is performed. Then, in this state, the semiconductor wafer 1 is installed in the cooling device for a desired time to carry out the cooling process. The semiconductor wafer 1 heated by the above-mentioned heating process can be cooled by this cooling process.

In this way, the coating step is completed by the coating/developing apparatus. When the coating step is completed, the semiconductor wafer 1 is grasped by the transfer arm 10 and transferred to an exposure apparatus (not shown). Then, in the exposure apparatus, an exposure step of exposing the resist using a desired photomask is performed.

Subsequently, when the exposure step is completed, the semiconductor wafer 1 is again grasped by the transfer arm 10 and transferred to the coating/developing apparatus.

Then, a developing step using the coating/developing apparatus is performed. In the developing step, first, a heating process and a cooling process are performed to reduce the standing wave effect in the resist film generated in the exposure step. Then, the resist 2 is developed to leave the resist in a desired pattern. Further, the resist 2 is baked by performing a heating process and a cooling process. Regarding the developing step at this time, the coating of the resist 2 shown in FIG. 1H in the coating step corresponding to FIGS. 1A to 1I is replaced with the development of the resist 2. The heating process and the cooling process are carried out by the same method. In this way, the patterning of the resist 2 is completed.

As described above, the heating process and the cooling process are performed in the coating step and the developing step performed by the coating/developing apparatus. When the heating process and the cooling process are performed, the heating device is set to a constant heating temperature and the cooling device is set to a constant cooling temperature. However, when the semiconductor wafer 1 is placed, the temperature of the heating plate 20 temporarily changes from the heating temperature, and the temperature of the cooling plate 30 temporarily changes from the cooling temperature.

Specifically, when the semiconductor wafer 1 is placed on the heating plate 20 in the heating process, the temperature of the semiconductor wafer 1 is lower than that of the heating plate 20. The temperature of the heating plate 20 is lowered by heat conduction to the semiconductor wafer 1 placed on the heating plate 20. On the contrary, when the semiconductor wafer 1 is placed on the cooling plate 30 in the cooling process, the temperature of the semiconductor wafer 1 is higher than that of the cooling plate 30. The cooling plate 30 is heated to a high temperature by heat transfer from the semiconductor wafer 1. Therefore, the temperature of the heating plate 20 which has a constant heating temperature and the temperature of the cooling plate 30 which has a constant cooling temperature temporarily change.

Therefore, in the abnormality detection system of the present embodiment, the temperature data of the heating plate 20 and the cooling plate 30 is acquired, and the abnormality is detected based on the temperature data. First, the configuration of the abnormality detection system will be described with reference to FIG. 2.

Figure 2:
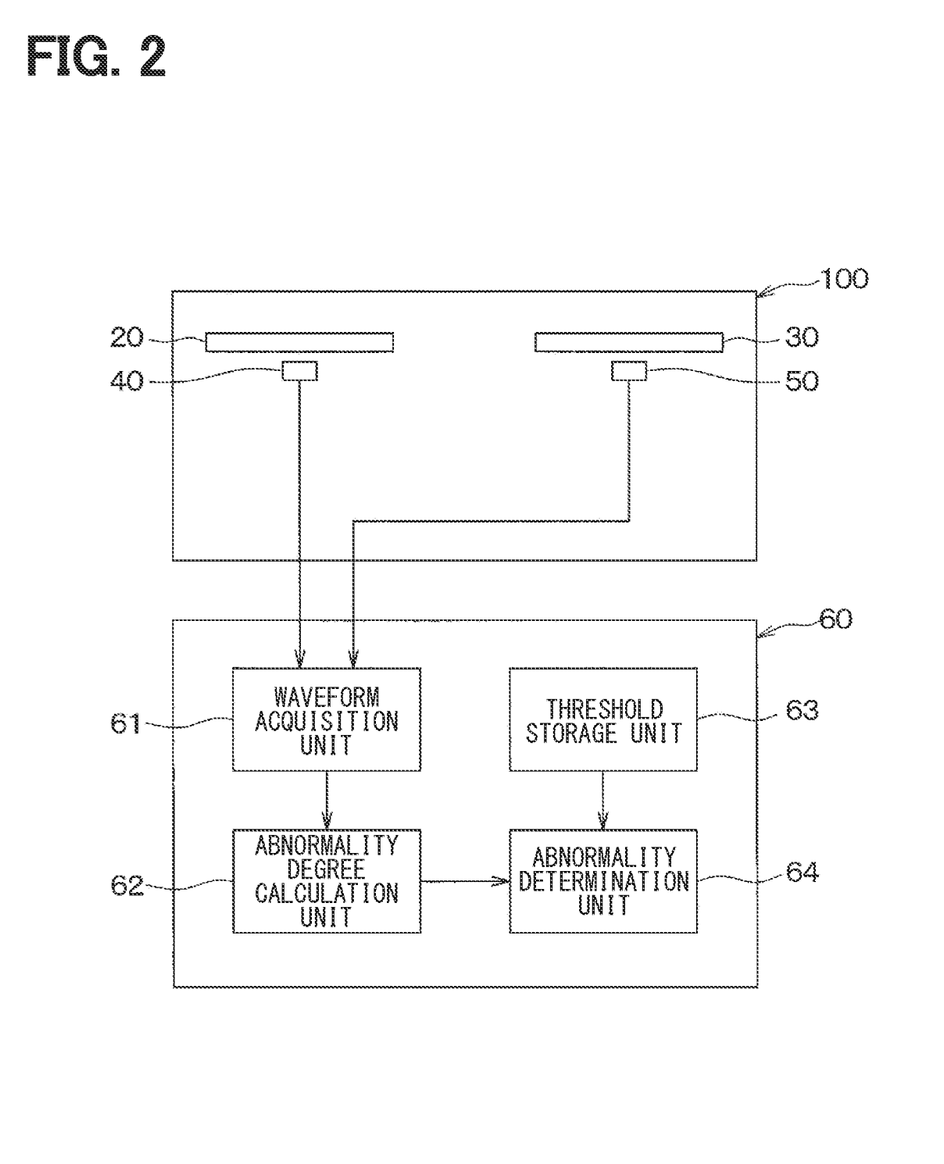
FIG. 2 is a block diagram showing a configuration of an abnormality detection system.

As shown in FIG. 2, the abnormality detection system includes temperature sensors 40 and 50 and a control unit 60.

The temperature sensor 40 is provided on the back surface of the heating plate 20 in the coating/developing device 100, and outputs a detection signal that becomes temperature data according to the temperature of the heating plate 20. The temperature sensor 50 is provided on the back surface of the cooling plate 30 in the coating/developing device 100, and outputs a detection signal that becomes temperature data according to the temperature of the cooling plate 30. The detection signals of the temperature sensors 40 and 50 are input to the control unit 60.

The control unit 60 is composed of a microcomputer equipped with a CPU, ROM, RAM, I/O, etc., and performs abnormality detection based on the detection signals output from the temperature sensors 40 and 50. Specifically, the control unit 60 includes a waveform acquisition unit 61, an abnormality degree calculation unit 62, a threshold storage unit 63, an abnormality determination unit 64, and the like as various functional units for performing the abnormality detection. Hereinafter, these various functional units will be described. Prior to that, the outline of abnormality detection by the abnormality detection system of the present embodiment will be described in comparison with a comparison abnormality detection method.

As described above, when the semiconductor wafer 1 is mounted on the heating plate 20 in the heating process or when the semiconductor wafer 1 is mounted on the cooling plate 30 in the cooling process, the heating plate 20 and the cooling plate 30 temporarily change in temperature.

However, in case of an abnormality process, the semiconductor wafer 1 is carried at the position on the guide portion 22, 32 of the heating plate 20 or the cooling plate 30. The temperature change is smaller in the abnormality process compared with a normal process in which the semiconductor wafer 1 is normally arranged without being positioned on the guide portion 22, 32. That is, when an abnormality occurs, the contact area between the semiconductor wafer 1 and the heating plate 20 or the cooling plate 30 becomes smaller than in the normal state. Since the heat conduction between the semiconductor wafer 1 and the heating plate 20 or the cooling plate 30 is smaller, the temperature change of the heating plate 20 and the cooling plate 30 becomes small. The control unit 60 detects an abnormality by utilizing this phenomenon.

Figure 3A:
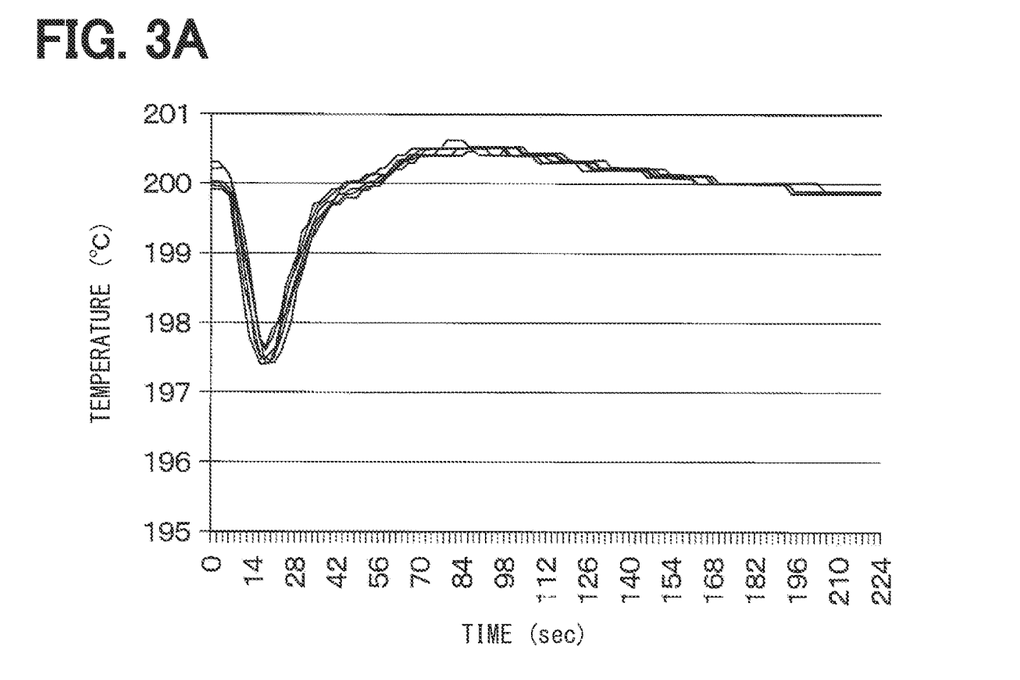
FIG. 3A is a diagram showing a change in temperature of a heating plate during normal processing over time.
Figure 3B:
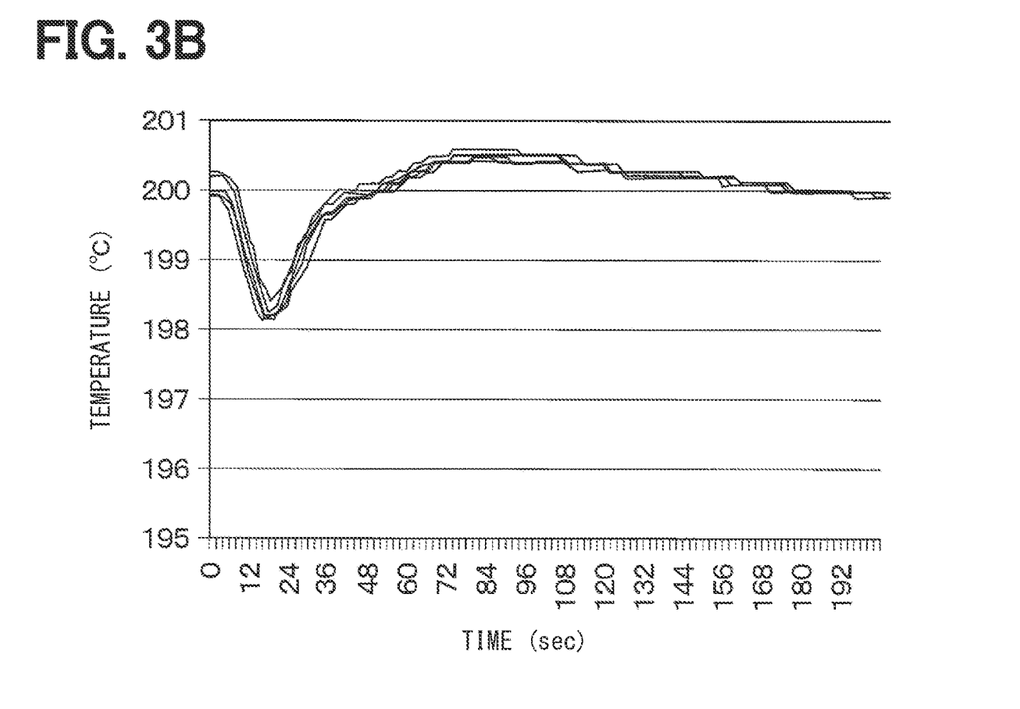
FIG. 3B is a diagram showing a change in temperature of a heating plate during abnormal processing over time.

FIG. 3A is normal data in the normal process in which the temperature of the heating plate 20 changes over time when the semiconductor wafer 1 is conveyed onto the heating plate 20 for the heating process. FIG. 3B is abnormal data in the abnormal process in which the temperature of the heating plate 20 changes over time when the semiconductor wafer 1 is conveyed onto the heating plate 20 for the heating process.

Figure 4A:
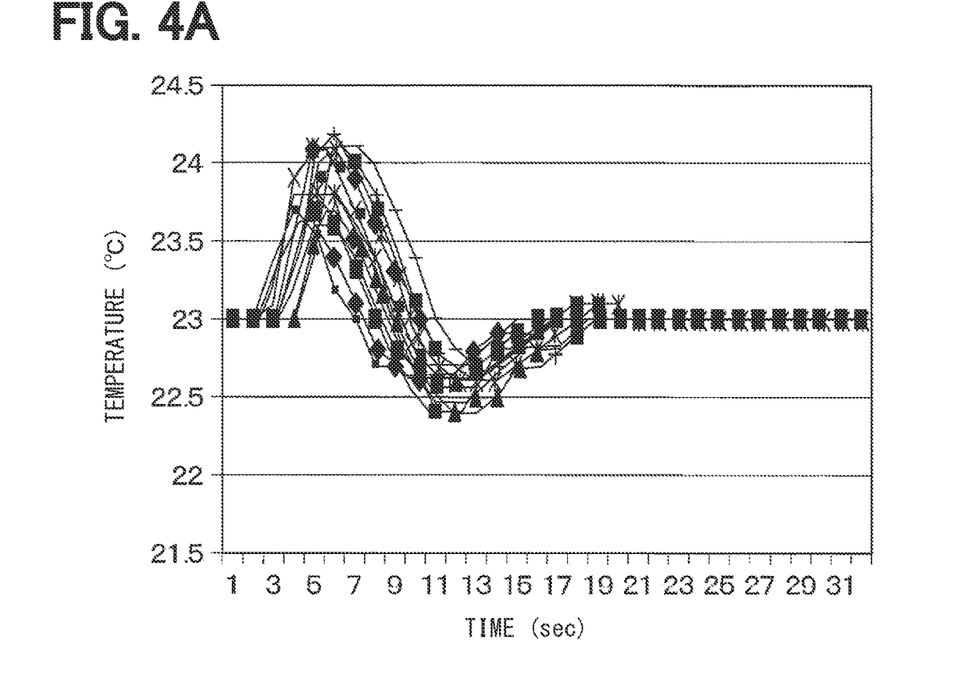
FIG. 4A is a diagram showing a change in temperature of a cooling plate during normal processing over time.
Figure 4B:
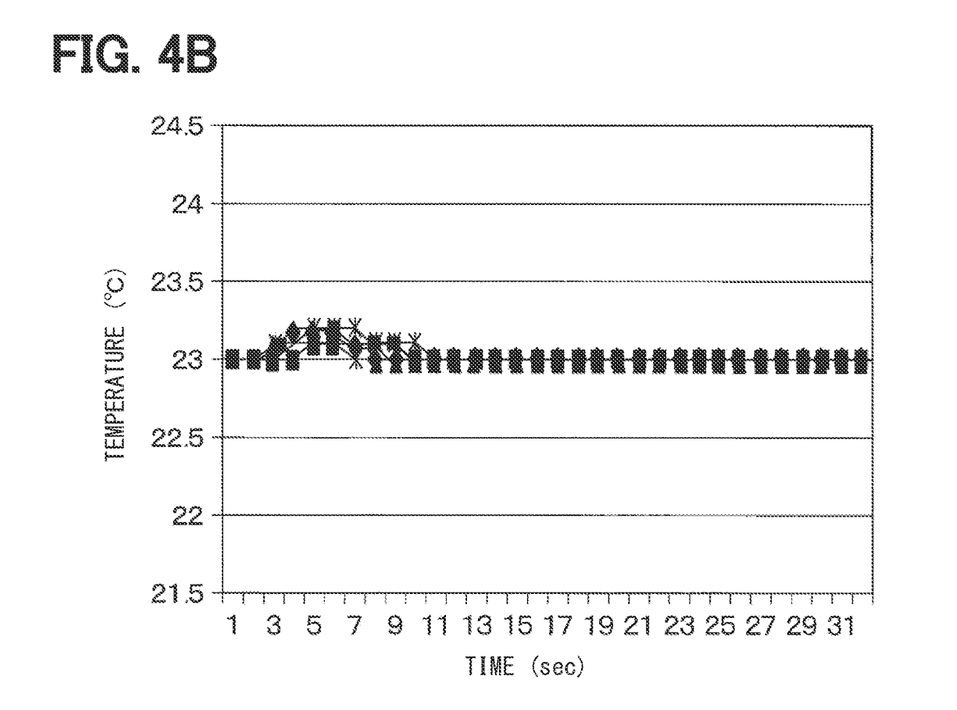
FIG. 4B is a diagram showing a change in temperature of a cooling plate during abnormal processing over time.

FIG. 4A is normal data in the normal process in which the temperature of the cooling plate 30 changes over time when the semiconductor wafer 1 after the heating process is conveyed onto the cooling plate 30 for the cooling process. FIG. 4B is abnormal data in the abnormal process in which the temperature of the cooling plate 30 changes over time when the semiconductor wafer 1 after the heating process is conveyed onto the cooling plate 30 for the cooling process.

Although the graphs are simplified in FIGS. 3A, 3B, 4A, and 4B, in reality, dozens of normal data and dozens of abnormal data are obtained. Further, the heating temperature is set to 200° C. and the cooling temperature is set to 23° C. as an example. The heating temperature and the cooling temperature are arbitrary and not limited.

As shown in FIGS. 3A and 3B, the temperature of the heating plate 20, which had a heating temperature of 200° C. is decreased with the placement of the semiconductor wafer 1, during both the normal process and the abnormal process. Then, the temperature of the heating plate 20 is increased again and stabilizes at 200° C. However, as can be seen from FIGS. 3A and 3B, the amount of temperature change is large during the normal process, and the amount of temperature change is small during the abnormal process as compared with the normal process.

As shown in FIGS. 4A and 4B, the temperature of the cooling plate 30, which had a cooling temperature of 23° C. is increased with the placement of the semiconductor wafer 1 during both the normal process and the abnormal process. Then, the temperature of the cooling plate 30 is decreased again and stabilizes at 23° C. However, as can be seen from FIGS. 4A and 4B, the amount of temperature change is large during the normal process, and the amount of temperature change is small during the abnormal process as compared with the normal process.

In an abnormality detection method of a comparison example, a temperature integrated area is calculated and compared with a threshold value to perform the abnormality detection. The temperature integrated area is an area of a range surrounded by a curve of this temperature change and a set temperature, such as 23° C.

Figure 5:
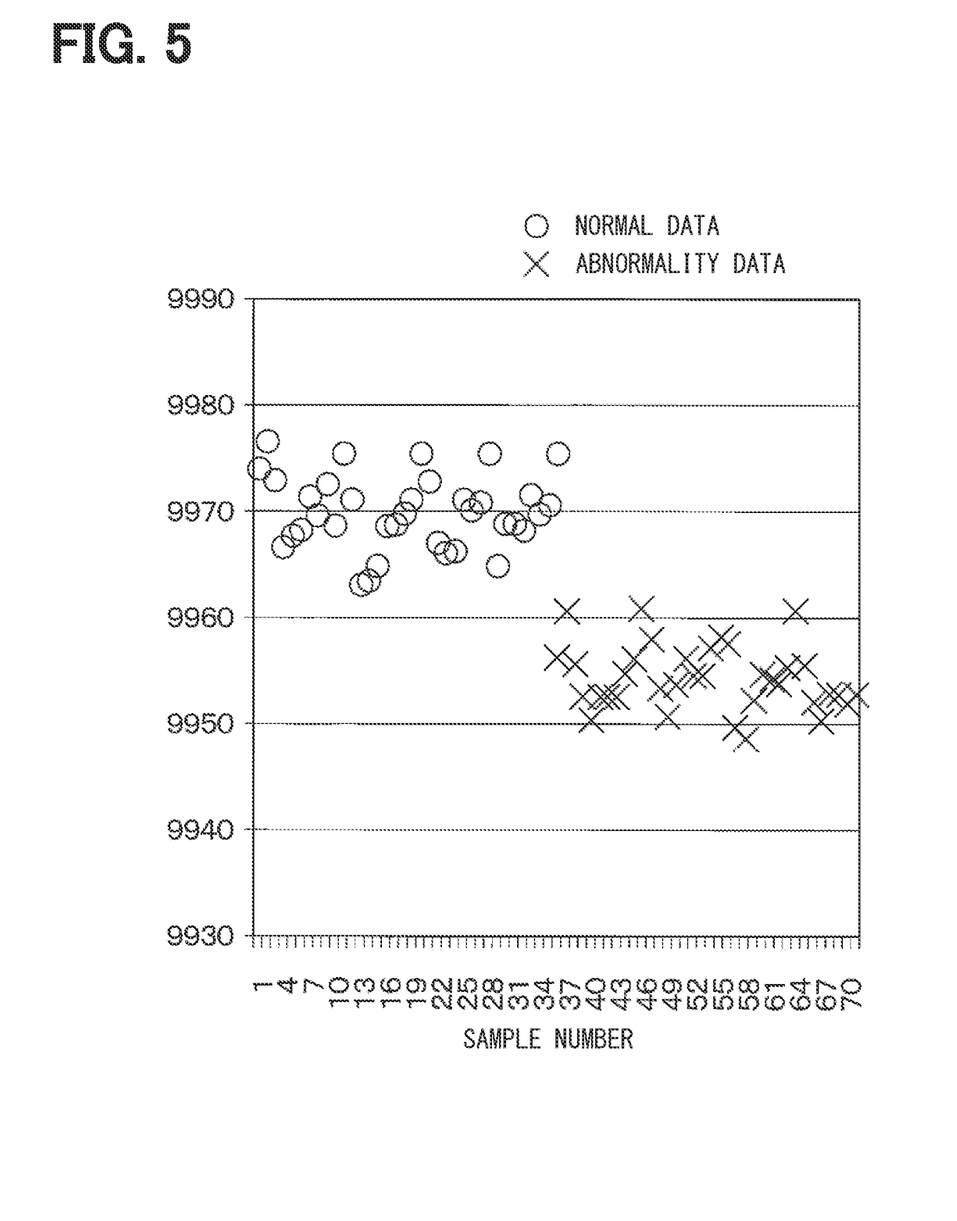
FIG. 5 is a diagram in which temperature integrated areas are plotted in normal data corresponding to FIG. 3A and abnormal data corresponding to FIG. 3B.

The temperature integrated area is obtained for each normal data in the case of normal process shown in FIG. 3A and each abnormal data in the case of abnormal process shown in FIG. 3B and plotted, as the result shown in FIG. 5. As shown in FIG. 5, the temperature integrated area of the normal data converges to the vicinity of 9965 to 9975, and the temperature integrated area of the abnormal data converges to the vicinity of 9950 to 9960. In this case, a threshold value can be set between the value at which the temperature integrated area of the normal data converges and the value at which the temperature integrated area of the abnormal data converges. Therefore, it is possible to accurately discriminate between the normally processed wafer and the abnormally processed wafer.

Figure 6:
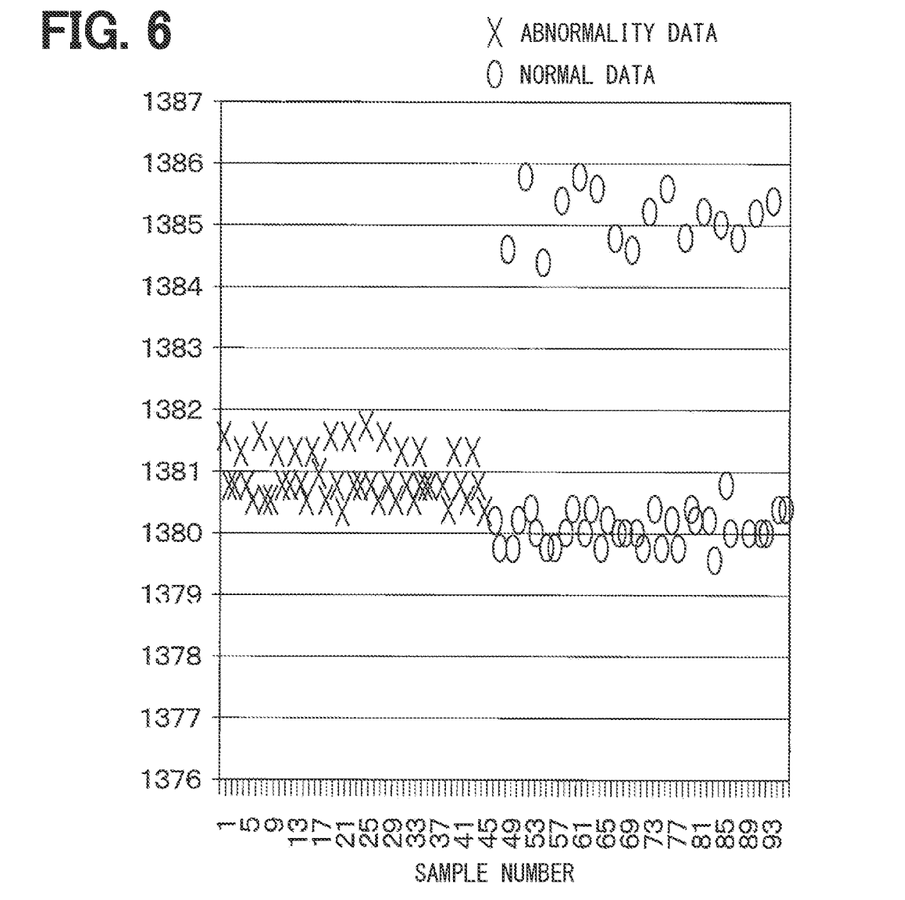
FIG. 6 is a diagram in which temperature integrated areas are plotted in normal data corresponding to FIG. 4A and abnormal data corresponding to FIG. 4B.

However, when the temperature integrated area for each normal data in the case of normal process shown in FIG. 4A and each abnormal data in the case of abnormal process shown in FIG. 4B are obtained and plotted, the result shown in FIG. 6 is obtained. As shown in FIG. 6, the temperature integrated area of the normal data converges to the vicinity of 1380 or 1385, and the temperature integrated area of the abnormal data converges to the vicinity of 1381 which is between 1380 and 1385. In this way, since the temperature integrated area of the abnormal data is converged to a value between the two values where the temperature integrated area of the normal data is converged, there is no difference between the temperature integrated area of the normal data and the temperature integrated area of the abnormality data. In this case, it is not possible to set a threshold value for discriminating between the normal data and the abnormal data based on the results, and it is not possible to accurately discriminate between a normally processed wafer and an abnormally processed wafer. It may happen that an abnormality is erroneously detected, as a result, the manufacturing may be interrupted even though the wafer is normally processed.

In the present embodiment, each temperature data is divided by unit time, and an absolute value of a temperature difference for each unit time is obtained. Then, a score value indicating the degree of abnormality is calculated from the cumulative value of the absolute value of the temperature difference based on Hotelling theory. Abnormality is detected based on the score value by determining whether the wafer is processed normally or abnormally.

Figure 7:
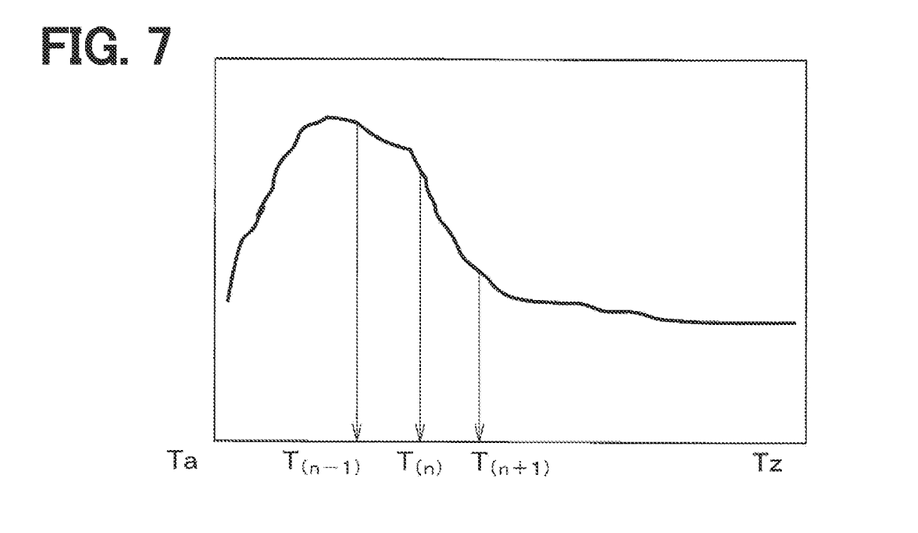
FIG. 7 is a diagram illustrating a method of obtaining an absolute value of a temperature difference for each unit time in a change of temperature from a temperature Ta to a temperature Tz in temperature data.

Specifically, as shown in FIG. 7, the absolute value of the temperature difference is obtained every predetermined unit time from a start temperature Ta at the start timing of the temperature change to a stable temperature Tz after the temperature change ends, relative to the temperature data. The cumulative value I of the absolute value of the temperature difference is calculated as following Equation 1. Note that T (n) means an arbitrary timing between the start timing and the end of the temperature change, and T (n+1) means a timing after a unit time elapses from T (n).

$$I = \int_{Ta}^{Tz} \{|T(n+1) - T(n)|\} dt \qquad \text{(Equation 1)}$$

Figure 8:
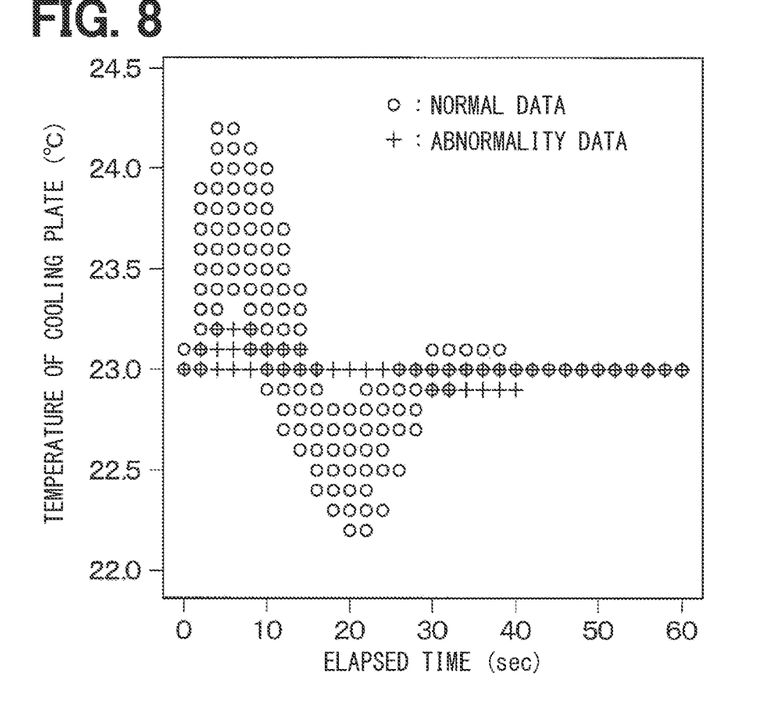
FIG. 8 is a diagram in which temperatures are plotted after extracted for each unit time from data shown in FIGS. 4A and 4B.

The temperature of each data shown in FIGS. 4A and 4B is extracted for each unit time and plotted as shown in FIG. 8. Then, the temperature difference between adjacent plots in each data is obtained, and the absolute value of the temperature difference is obtained. The cumulative value of the temperature difference is plotted for each elapsed time, as shown in FIG. 9.

Figure 9:
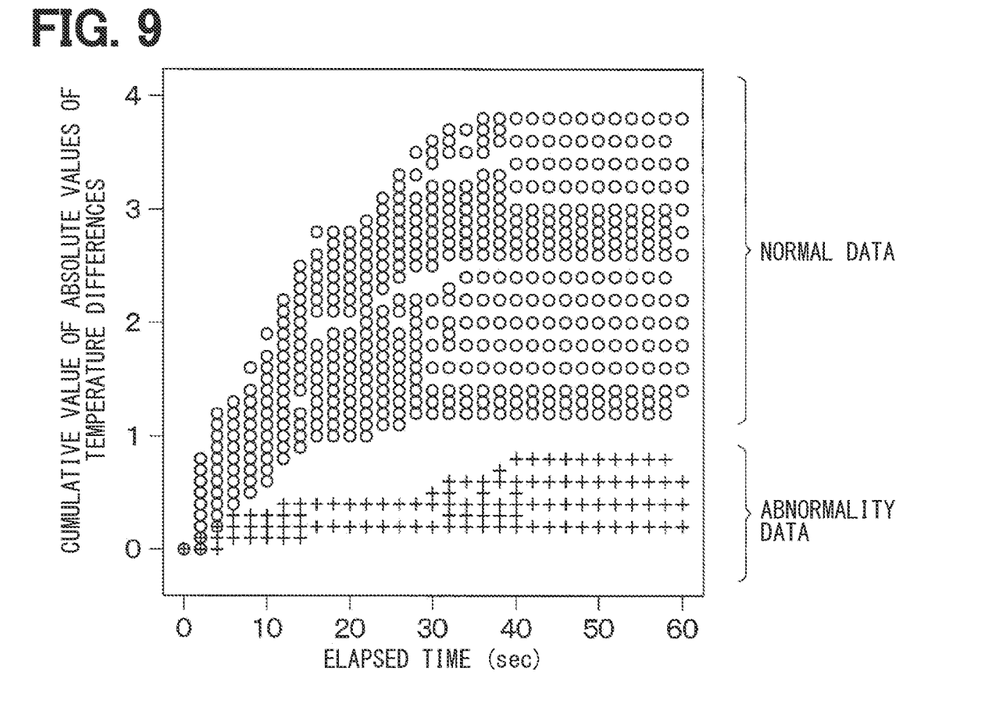
FIG. 9 is a diagram in which a cumulative value of absolute values of temperature differences is plotted relative to an elapsed time.

Here, in the temperature data, the score value is calculated from the rightmost plotted value in FIG. 9, which is the cumulative value of the absolute values in the temperature difference for each unit time in a period from the start temperature Ta at the start timing of the temperature change to the temperature Tz after the temperature change is completed and stabilized. As a method of calculating the score value, various methods for scoring normal data and abnormal data can be used. In the present embodiment, the score value is calculated by detecting an abnormality from the cumulative value using Hotelling theory.

Figure 10A:
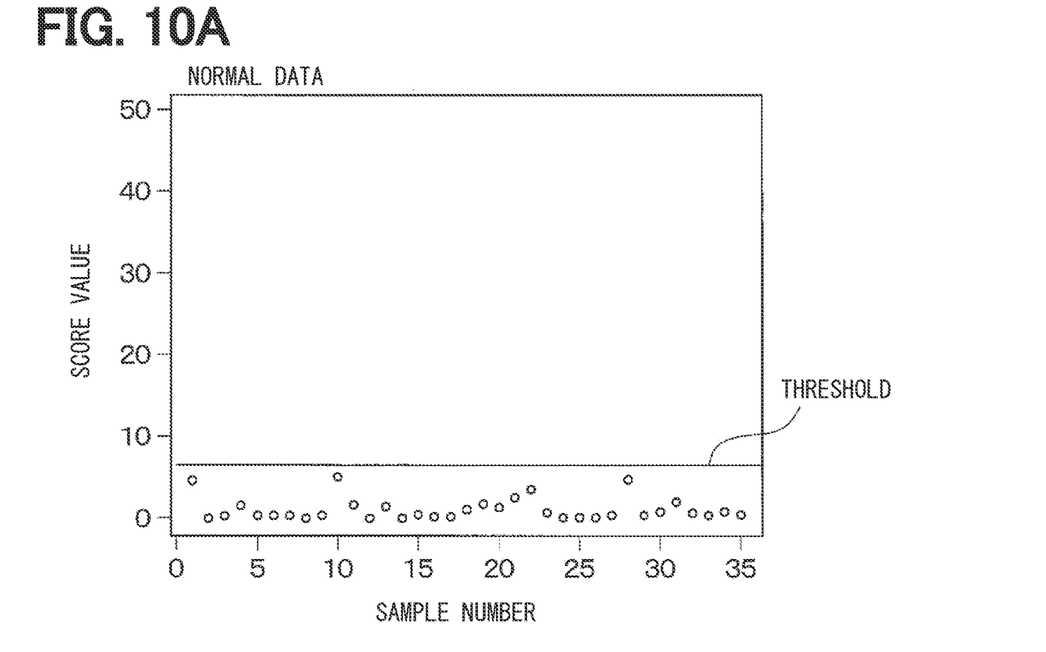
FIG. 10A is a diagram in which a score value obtained from normal data is plotted.
Figure 10B:
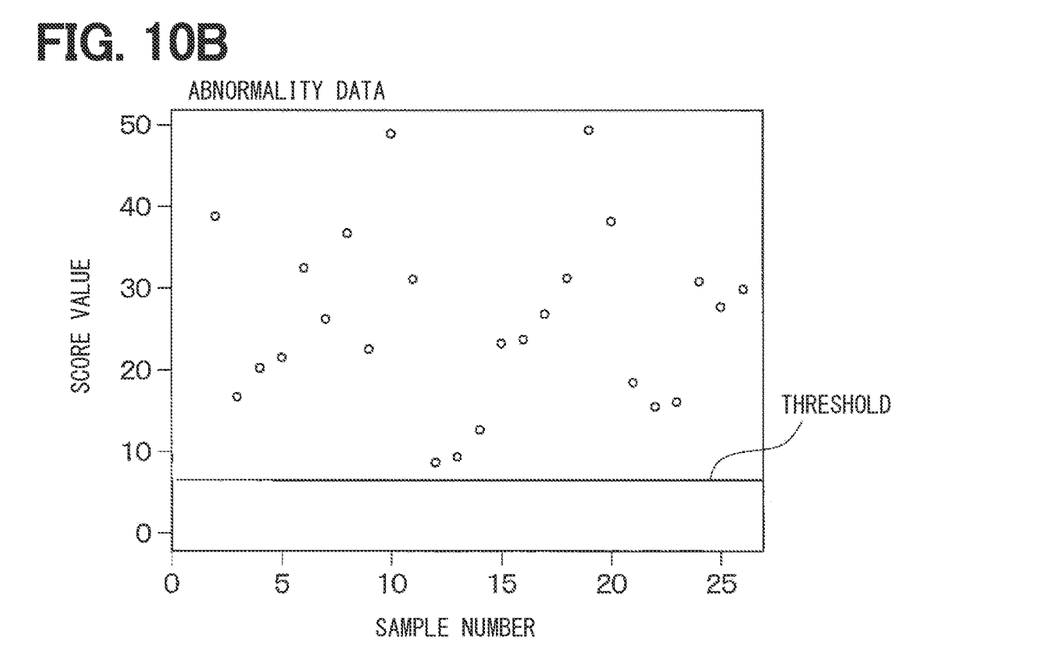
FIG. 10B is a diagram in which a score value obtained from abnormal data is plotted.

The score value serves as an index indicating the degree of abnormality in the heating process and the cooling process. FIGS. 10A and 10B include plots of the score values obtained from several tens of the normal data and the abnormal data. As shown in FIGS. 10A and 10B, the score values of the normal data are low, and the score values of the abnormal data are higher than the score values of the normal data. Therefore, a threshold value can be set between the score value of the normal data and the score value of the abnormal data. If the score value is lower than the threshold value, it can be determined as normal data. If the score value is higher than the threshold value, it can be determined as abnormal data. In the abnormality detection system of the present embodiment, abnormality detection is performed by such a method. Hereinafter, details of the waveform acquisition unit 61, the abnormality degree calculation unit 62, the threshold storage unit 63, and the abnormality determination unit 64, which are various functional units provided in the control unit 60, will be described based on such an abnormality detection method.

The waveform acquisition unit 61 inputs the detection signal output by the temperature sensor 40 and the temperature sensor 50. The detection signal input from the temperature sensor 40 and the temperature sensor 50 becomes raw waveform data indicating the temperature of the heating plate 20 and the cooling plate 30.

The abnormality degree calculation unit 62 calculates the abnormality degree in the heating process and the cooling process based on the raw waveform data of the temperatures of the heating plate 20 and the cooling plate 30 acquired by the waveform acquisition unit 61. The degree of abnormality referred to here is the score value described above. Based on the above Equation 1, the absolute value of the temperature difference is obtained from the raw waveform data every predetermined unit time from the temperature Ta at the start timing of the temperature change to the temperature Tz after the temperature change is completed and stabilized. The score value is obtained by calculating the cumulative value and calculating the negative logarithmic likelihood.

The threshold storage unit 63 stores a threshold value set between the score value of normal data and the score value of abnormal data, and is composed of a non-transitional tangible storage medium such as a memory. The threshold value has been obtained in advance by experiments or the like. A normal model created based on normally processed data is prepared, and the score value is calculated from each of the normally processed data and the abnormally processed data. Then, a threshold value is set as a value between the score value obtained from the normal data in the normal process and the score value obtained from the abnormal data in a plurality of abnormal processes.

In other words, a normal distribution, which is the distribution of score values in the normal process, can be created by collecting multiple score values obtained from normal data when the normal process is performed. If it deviates from the normal distribution, it is considered to be a score value when an abnormal process is performed. Therefore, the value that is the boundary between the score value obtained from the normal data in the normal process and the score value obtained from the abnormal data in the plurality of abnormal processes is set as a threshold. For example, the maximum score value included in the normal distribution is set as a threshold.

The threshold value is individually set for each heating process and each cooling process of the coating step and the developing step. The individually set threshold value is stored in the threshold storage unit 63.

The abnormality determination unit 64 compares the score value, which is the degree of abnormality calculated by the abnormality degree calculation unit 62, with the corresponding threshold value stored in the threshold storage unit 63. Thus, it is determined whether the score value is the score value of the normal data or the score value of the abnormal data. In other words, the abnormality determination unit 64 determines whether the data waveform acquired by the waveform acquisition unit 61 is normal or abnormal by comparing the degree of abnormality with the threshold value.

For example, if the score value is calculated from the raw waveform data of the temperature of the cooling plate 30 in the cooling process of the coating step, the score value is compared with the threshold value set as the cooling process of the coating step. Then, if the score value is equal to or less than the threshold value, it is determined to be the score value of normal data. If the score value is larger than the threshold value, it is determined to be the score value of abnormal data. Further, when the abnormality determination unit 64 detects the score value of the abnormality data, the abnormality determination unit 64 transmits the abnormality detection to the outside. For example, the abnormality determination unit 64 notifies that an abnormality process has been performed through a notification device (not shown). The notification device may be any notification device such as a visual notification such as a display or an auditory notification using sound such as a buzzer.

As described above, in the abnormality detection system of the present embodiment, during the heating process and the cooling process, the cumulative value of the absolute value in the temperature difference for each unit time is obtained from the temperature data of the heating plate 20 and the cooling plate 30. Then, the score value indicating the degree of abnormality is obtained. Then, by comparing the score value with the preset threshold value, it is determined whether the score value is the normal data or the abnormal data. In this way, accurate abnormality detection can be performed by performing abnormality detection using the score value obtained from the cumulative value of the absolute values in the temperature difference for each unit time as the degree of abnormality. Then, according to such an abnormality detection method, it is possible to detect an abnormality each time in a heating process or a cooling process, so that it is possible to detect an abnormality more quickly.

Although the present disclosure is described with reference to such embodiment, the present disclosure is not limited to such embodiments but may include various changes and modifications which are within equivalent ranges. In addition, as the various combinations and configurations, which are preferred, other combinations and configurations, including more, less or only a single element, are also within the spirit and scope of the present disclosure.

In the above embodiment, a heating process and a cooling process are described when the resist 2 is applied and developed on the semiconductor wafer 1. The temperature measurement target is a plate for mounting the semiconductor wafer 1 such as a heating plate 20 and a cooling plate 30. However, these are only examples. The present disclosure can be applied to a case where it is determined whether the waveform data is normal or abnormal based on the waveform data showing the temperature measurement result of another temperature measurement target.

In addition, when abnormality detection is performed using waveform data that changes in time series, abnormality detection can be performed in the same manner. That is, the abnormality can be detected by obtaining the degree of abnormality from the cumulative value of the absolute values in the difference of the data values for each unit time in the waveform data and comparing the degree of abnormality with a preset threshold value. Abnormality detection can be conducted using such waveform data to determine whether a gas flow rate is normal or abnormal. In that case, since the amount of change from a constant gas flow rate appears in the waveform data, the score value is obtained using the waveform data of the gas flow rate, from the cumulative value of the absolute value in the difference of the gas flow rate for each unit time in the waveform data. In this case as well, since the abnormality can be detected each time, the abnormality can be detected more quickly.

The control unit and the method described in the present disclosure may be implemented by a special purpose computer which is configured with a memory and a processor programmed to execute one or more particular functions embodied in computer programs of the memory. Alternatively, the control unit and the method described in the present disclosure may be implemented by a special purpose computer configured as a processor with one or more special purpose hardware logic circuits. Alternatively, the control unit and the method described in the present disclosure may be implemented by one or more special purpose computer, which is configured as a combination of a processor and a memory, which are programmed to perform one or more functions, and a processor which is configured with one or more hardware logic circuits. The computer programs may be stored, as instructions to be executed by a computer, in a tangible non-transitory computer-readable medium.

What is claimed is:

1. An abnormality detection system for a manufacturing process comprising:
    at least one processor and/or at least one circuit configured to
    acquire, in a waveform acquisition unit, waveform data that changes over time;
    calculate, in an abnormality degree calculation unit, an abnormality degree based on a cumulative value obtained by accumulating absolute values of differences in data values for each unit time from the waveform data acquired by the waveform acquisition unit;
    determine, in an abnormality determination unit, whether the waveform data is normal or abnormal based on the abnormality degree calculated by the abnormality degree calculation unit; and
    control the manufacturing process based on the abnormality degree, wherein
    the waveform data that changes over time indicates a result of a temperature measurement of a temperature measurement target, and
    the abnormality degree calculation unit calculates the cumulative value represented by I in a following Equation:

$$I=\int_{Ta}^{Tz}\{|T(n+1)-T(n)|\}dt$$

wherein the cumulative value is obtained by accumulating absolute values of differences in temperature measured for each unit time, Ta representing a temperature at a start timing of a temperature change indicated by the waveform data, Tz representing a temperature Tz at an end of the temperature change,
    T(n) represents an arbitrary timing between the start timing and the end of the temperature change, and
    T(n+1) represents a timing after the unit time is elapsed from the arbitrary timing.

2. The abnormality detection system according to claim 1, wherein the at least one processor and/or at least one circuit is further configured to
    store, in a threshold storage, a threshold value to be compared with the abnormality degree,
    wherein the abnormality determination unit is configured to determine whether the waveform data is normal or abnormal by comparing the abnormality degree with the threshold value.

3. The abnormality detection system according to claim 2, wherein
    the abnormality degree calculation unit is configured to calculate a degree of abnormality in case of a normal data when the waveform data is normal and a degree of abnormality in case of an abnormal data when the waveform data is abnormal, and
    the threshold value stored in the threshold storage is a predetermined value between the degree of abnormality in case of the normal data and the degree of abnormality in case of the abnormal data.

4. The abnormality detection system according to claim 1, wherein the temperature measurement target is a plate on which a semiconductor wafer is mounted when the semiconductor wafer is heated or cooled.

5. The abnormality detection system according to claim 4, wherein the plate is a heating plate, further comprising
    a temperature sensor provided on a back surface of the heating plate and configured to output a detection signal to the waveform acquisition unit.

6. The abnormality detection system according to claim 1, wherein the temperature measurement target is a cooling plate on which a semiconductor wafer is mounted when the semiconductor wafer is cooled.

7. The abnormality detection system according to claim 6, further comprising
    a temperature sensor provided on a back surface of the cooling plate and configured to output a detection signal to the waveform acquisition unit.

* * * * *